US 6,549,426 B1

(12) United States Patent
Lawlyes et al.

(10) Patent No.: US 6,549,426 B1
(45) Date of Patent: Apr. 15, 2003

(54) ELECTRONIC ENCLOSURE WITH IMPROVED EMC PERFORMANCE

(75) Inventors: Daniel A. Lawlyes, Kokomo, IN (US); Roy A. Visser, Greentown, IN (US)

(73) Assignee: Delphi Tecnologies, Inc, Troy, MI (US)

( * ) Notice: Subject to any disclaimer, the term of this patent is extended or adjusted under 35 U.S.C. 154(b) by 0 days.

(21) Appl. No.: 10/159,533

(22) Filed: May 31, 2002

(51) Int. Cl.[7] .................................................. H05K 9/00
(52) U.S. Cl. ...................... 361/816; 361/818; 361/800; 361/752; 174/35 R; 174/35 GC
(58) Field of Search .................... 361/816, 818, 361/800, 752; 174/32, 35 R, 35 GC; 307/91; 330/68; 334/85; 338/64; 343/841

(56) References Cited

U.S. PATENT DOCUMENTS

| | | | |
|---|---|---|---|
| 2,527,908 A | * 10/1950 | Blitz | ........................... 178/44 |
| D312,618 S | * 12/1990 | Ambros | ..................... D13/184 |
| 5,354,951 A | * 10/1994 | Lange, Sr. et al. | ...... 174/35 GC |
| 5,565,656 A | * 10/1996 | Mottahed | ............... 174/35 GC |
| 5,600,091 A | * 2/1997 | Rose | ........................ 174/35 R |
| 5,880,400 A | * 3/1999 | Leischner et al. | ...... 174/17 CT |

* cited by examiner

*Primary Examiner*—David Martin
*Assistant Examiner*—Dameon E. Levi
(74) *Attorney, Agent, or Firm*—Jimmy L. Funke

(57) ABSTRACT

An electronics assembly 10 is provided, including a base element 16 and a cover element 18. The base element 16 includes a perimeter mating groove 20 and the cover element 18 including a perimeter tongue element 26. A plurality of crush ribs 34 are formed into the perimeter tongue element 26 such that when the perimeter tongue element 26 is positioned within the perimeter mating groove 20 during assembly, the plurality of crush ribs 34 establish conductive contact between the base element 16 and the cover element 18.

18 Claims, 2 Drawing Sheets

ELECTRONIC ENCLOSURE WITH IMPROVED EMC PERFORMANCE

TECHNICAL FIELD

The present invention relates generally to an electronic enclosure with improved EMC performance. More specifically, the present invention relates to an electronic enclosure with improved EMC performance capable of operating within a hostile environment.

BACKGROUND OF THE INVENTION

A variety of design characteristics must be considered in the development of electronic applications. Cost, size, thermal capabilities, and operating limits must often be considered in order to produce a successfull end-product. One such characteristic that must be considered is known as Electro Magnetic Compatibility (EMC). Electronic products and components often radiate fields during operation. These fields can cause electro magnetic interference in surrounding products or components. Additionally, an electronic product or component must be protected from such radiated fields produced by neighboring electronics. Electro Magnetic Compatibility is the ability of such products or components to withstand localized radiated fields as well as the ability of such products to reduce the impact of their own radiated fields on neighboring components.

Although numerous coatings and casing agents have been developed in order to improve a component's EMC, often these solutions can run counter to other important design considerations. Manufacturing costs can be negatively impacted where additional coatings or manufacturing procedures are necessary. Weight and size restrictions can be negatively impacted wherein the EMC improving elements serve to increase a products dimensions. Coatings and casings can make proper thermal dissipation of the electronic component difficult. One particular design consideration of import to the automotive industry is the ability to withstand a corrosive environment.

Engine control modules, transmission controllers, and power train controllers are all often subjected to hostile environments. Design constraints commonly dictate such components be protected from such hostile environments through the use of a sealed or a semi-sealed housing. Additionally, however, these housings (or casings) must serve as an EMC barrier between the controllers and the surrounding environment. An enclosure that could successfully combine the characteristics of hostile environmental capabilities and EMC barrier improvement would be highly desirable. Furthermore, an enclosure design that could accomplish these goals without significant adverse impact on weight, cost, size, or thermal dissipation would be even further valued.

SUMMARY OF THE INVENTION

It is, therefore, an object of the present invention to provide an electronic enclosure with improved EMC performance. It is a further object of the present invention to provide an electronic enclosure capable of usage within hostile environments.

In accordance with the objects of the present invention, an electronics assembly is provided. The electronics assembly includes an electronics enclosure and an electronic component positioned within the electronics enclosure. The electronics enclosure includes a base element including a perimeter mating groove defined by an inner groove wall and an outer groove wall. The electronics enclosure additionally includes a cover element including a perimeter tongue element. The perimeter tongue element fits within the perimeter mating groove upon assembly of the electronics enclosure. The electronics enclosure further includes a plurality of crush ribs formed onto the perimeter tongue element. The plurality of crush ribs pierces the base element to create a contiguous protective shield surrounding the electronic component.

Other objects and features of the present invention will become apparent when viewed in light of the detailed description of the preferred embodiment when taken in conjunction with the attached drawings and appended claims.

DESCRIPTION OF THE PREFERRED EMBODIMENT(S)

Figure 1:
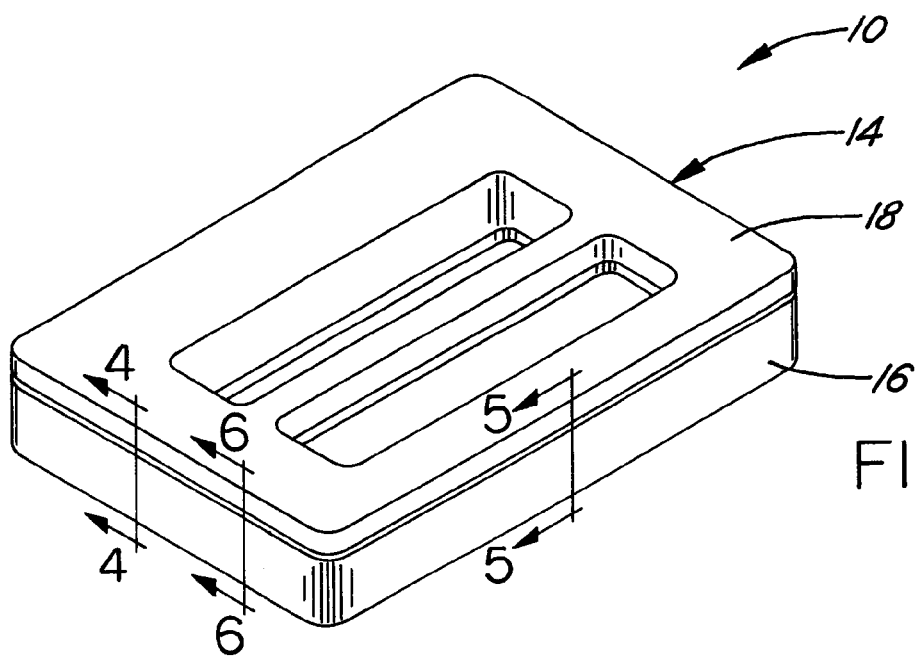
FIG. 1 is an illustration of an embodiment of an electronics assembly in accordance with the present invention.

Referring now to FIG. 1, which is an illustration of an electronics assembly 10 in accordance with the present invention. The electronics assembly 10 is intended for a variety of applications, although it was conceived for use in automotive applications including corrosive environments. Specifically, it was conceived that the present invention may be utilized for use as an automotive engine controller. Alternate embodiments include, but are not limited to, transmission controllers as well as non-automotive powertrain controllers.

The electronics assembly 10 includes an electronics enclosure 14. The electronics enclosure 14 is comprised of a base element 16 and a cover element 18. It is contemplated that the base element 16 and the cover element 18 may be formed from a variety of materials, using a variety of manufacturing techniques, and in a variety of configurations. In one embodiment, however, the base element 16 and cover element 18 are formed using a die-cast production technique and are formed utilizing an aluminum alloy material. The use of die-cast production allows for a relatively inexpensive manufacturing for the present invention. Although an aluminum alloy material has been described, it should be understood that a variety of materials capable of creating a cage-effect for minimizing electromagnetic interference capable of penetrating the electronics enclosure 14 would be suitable for use with the present invention.

The base element 16 includes a perimeter mating groove 20 defined by an outer groove wall 22 and an inner groove wall 24. A perimeter tongue element 26 formed into the cover element 18 fits within the perimeter mating groove 20 upon assembly of the electronics assembly 10. An electronic component 28 is positioned within a cavity 30 formed between the base element 16 and the cover element 18 such that the electronic component 28 is encased by the electronics enclosure 14. Although a variety of electronics components 28 are contemplated by the present invention, one embodiment contemplates the use of high-speed electronics. The perimeter mating groove 20 and perimeter tongue element 26 may be formed in a variety of configurations such that a tongue/groove mating combination is formed. Similarly, although the perimeter tongue element 26 is described as formed on the cover element 18 and the perimeter mating groove 20 is described as formed on the base element 16, it should be understood these positions could be reversed.

The tongue/groove 26, 20 relationship also allows for a dual purpose mating relationship between the cover element 18 and the base element 16. An adhesive material 32 may be positioned within the perimeter mating groove 20 in order to seal the electronic enclosure 14 to make it suitable for use in hostile or corrosive environments (see FIG. 3). In one embodiment, a silicone adhesive is contemplated, however, a wide variety of adhesive materials 32 would be obvious to one skilled in the art. The second half of the dual purpose mating relationship involves a conductive contact between the cover element 18 and the base element 16 such that a cage effect surrounding the electronic component 28 is formed. Cage effect improves the electromagnetic compatibility of the enclose electronics component 28. Thus, the electromagnetic interference caused and/or suffered by the electronics component 28 can be reduced. It can be important, however, that any conductive contact between the cover element 18 and the base element 16 does not negatively impact the seal such that the electronic enclosure's 14 suitability for use within a hostile environment is compromised. In this light, the present invention includes a plurality of crush ribs 34 formed onto the perimeter tongue element 26. The plurality of crush ribs 34 create a conductive bond between the base element 16 and the cover element 18 without compromising the integrity of the adhesive joint 32.

Figure 2:
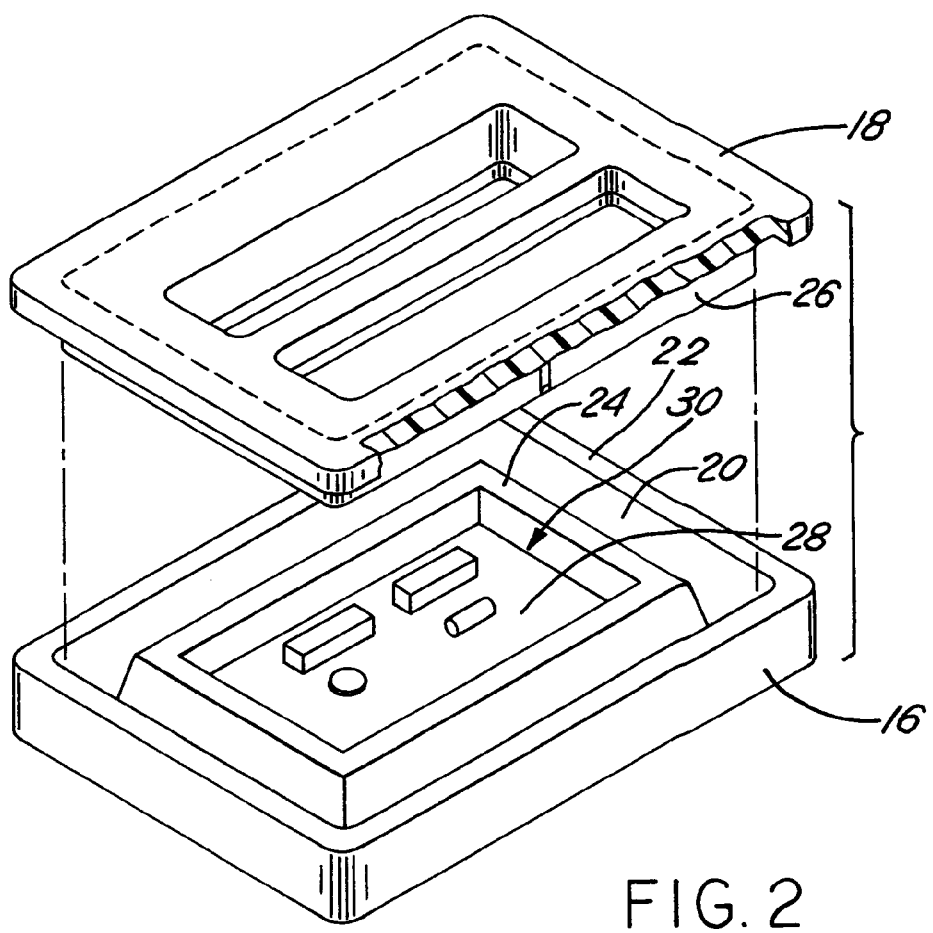
FIG. 2 is an exploded view illustration of the electronics assembly illustrated in FIG. 1.
Figure 3:
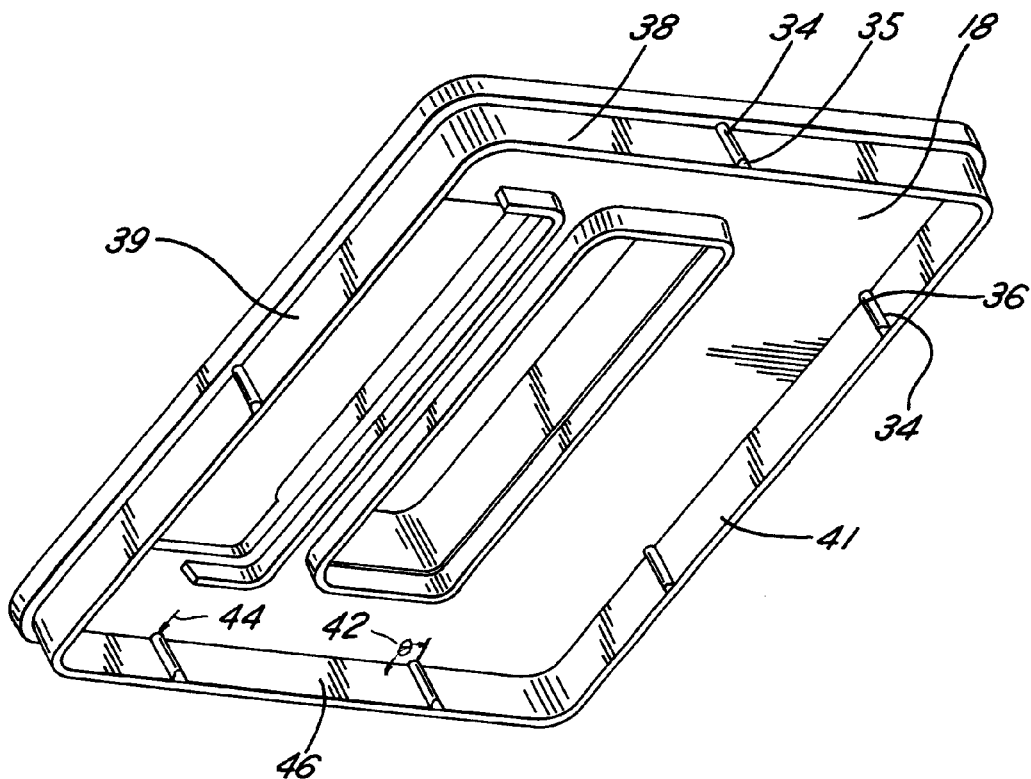
FIG. 3 is a detail of the cover element for use in the electronics assembly in accordance with the present invention.
Figure 4:
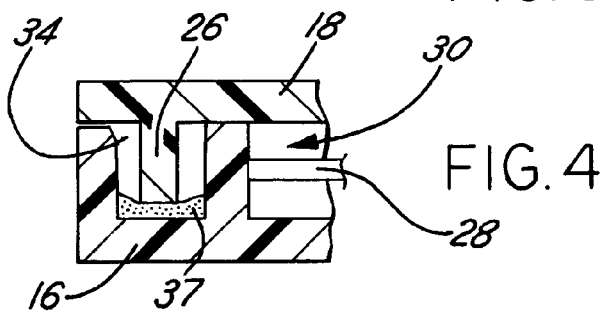
FIG. 4 is a cross-sectional detail of the electronics assembly illustrated in FIG. 1, the cross-section taken along the lines 4—4 in the direction of the arrows.
Figure 5:
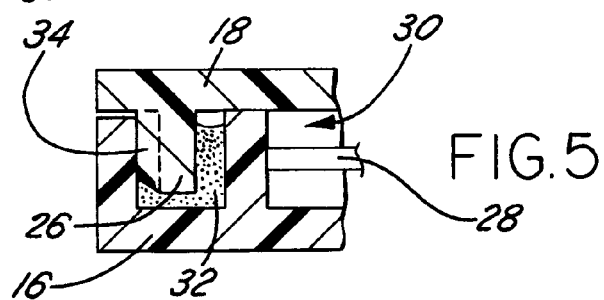
FIG. 5 is a cross-sectional detail of the electronics assembly illustrated in FIG. 1, the cross section taken along the lines 5—5 in the direction of the arrows.
Figure 6:
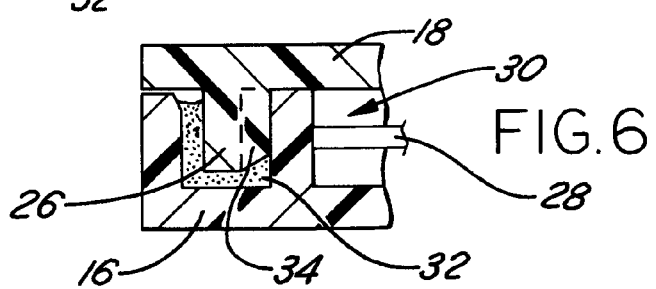
FIG. 6 is a cross-sectional detail of the electronics assembly illustrated in FIG. 1, the cross section taken along the lines 6—6 in the direction of the arrows.

Although the plurality of crush ribs 34 can be configured and manufactured in a variety of fashions, one embodiment is illustrated in FIGS. 2 and 3. The plurality of crush ribs 34 can be die-cast into the perimeter tongue element 26 and thereby have minimal cost to implement. Although the plurality of crush ribs 34 may be formed in a variety of shapes and configurations, the illustrated embodiment contemplates the use of triangular plate elements 36. These triangular plate elements 36 can be positioned between the perimeter tongue element 26 and the outer groove wall 22 (see FIG. 5), between the perimeter tongue element 26 and the inner groove wall 24 (see FIG. 6), or in both locations (see FIG. 4). In one embodiment, see FIG. 3, the positions of tile plurality of crush ribs 34 are alternated between an outer wall configuration and an inner wall configuration to allow for increased flexibility of the perimeter tongue element 26. The shape and configuration of the plurality of crush ribs 34 allow the cover element 18 and the base element 16 to remain in conductive contact through mechanical press-fit. A leading edge chamfer 35 may be formed to ease initial insertion of the perimeter tongue element 26 into the perimeter mating grove 20. Additionally, movement is restrained through the use of the adhesive joint 32. It is contemplated that in at least some embodiments, the plurality of crush ribs 34 will actually pierce the walls 22,24 of the perimeter mating groove 20 to insure proper conductive contact as well as work in combination with the adhesive joint 32 to prevent relative movement or loss of contact after assembly.

The number and position of the plurality of crush ribs 34 may be adjusted in order to adjust the electromagnetic compatibility of the electronics assembly 10. In one embodiment it is contemplated that the plurality of crush ribs 34 will be evenly spaced around the four sides 38,39,40,41 of the perimeter tongue element 26. In other embodiments, however, alternate spacing may be utilized. Similarly, the dimensional characteristics of the plurality of crush ribs 34 may be modified. It is desirable for the plurality of crush ribs 34 to be sized such that they breach the sides of the perimeter mating groove 20 upon assembly of the electronics enclosure 14. Additionally, however, the angle 42 and/or radii 44 of the plurality of crush ribs 34 may be modified such that minimal forces are applied to the electronics enclosure 14 as well to minimize inward and outward forces on the adhesive joint 32. Although this may be accomplished in a variety of fashions, one embodiment contemplates minimizing the angle 42 or maximizing the radii 44 as is allowed by the dimensional constraints of the perimeter mating groove 20/perimter tongue element 26 geometrical relationship. The present invention, thereby, provides an inexpensive and simplistic method of improving EMC performance.

While particular embodiments of the invention have been shown and described, numerous variations and alternative embodiments will occur to those skilled in the art. Accordingly, it is intended that the invention be limited only in terms of the appended claims.

What is claimed is:

1. An electronics assembly comprising:
   an electronic enclosure, including a base element and a cover element;
   a perimeter mating groove defined by an inner groove wall and an outer groove wall, said perimeter mating groove formed in said base element;
   a perimeter tongue element formed on said cover element, said perimeter tongue element positioned within said perimeter mating groove upon assembly of said electronics enclosure; and
   plurality of crush ribs formed into said perimeter tongue element, said plurality of crush ribs providing conductive contact between said base element and said cover element such that a contiguous protective shield is formed around an electronics component positioned within said electronics enclosure.

2. An electronics assembly comprising as described in claim 1, further comprising:
   an adhesive material positioned within said perimeter mating groove such that said cover element is sealed to said base element.

3. An electronics assembly as described in claim 1, wherein said base element and said cover element comprise an aluminum alloy.

4. An electronics assembly as described in claim 1, wherein said plurality of crush ribs are die cast into said perimeter tongue element.

5. An electronics assembly as described in claim 1, wherein said plurality of crush ribs comprise triangular plate elements.

6. An electronics assembly as described in claim 1, wherein said plurality of crush ribs are spaced evenly around said perimeter of said perimeter tongue element.

7. An electronics assembly as described in claim 1,
wherein said plurality of crush ribs are positioned between said perimeter tongue element and said outer groove wall, said plurality of crush ribs providing conductive communication between said perimeter tongue element and said outer groove wall.

8. An electronics assembly as described in claim 1,
wherein said plurality of crush ribs are positioned between said perimeter tongue element and said inner groove wall, said plurality of crush ribs providing conductive communication between said perimeter tongue element and said inner groove wall.

9. An electronics assembly as described in claim 1,
wherein each of said plurality of crush ribs is defined by an angle, said angle being minimized to allow contact between said plurality of crush ribs and said perimeter mating groove while minimizing any force applied to said perimeter mating groove by said plurality of crush ribs.

10. An electronics assembly as described in claim 1,
wherein each of said plurality of crush ribs include a leading edge chamfer, said leading edge chamfer improving the assembly of said cover element and said base element.

11. An electronics enclosure comprising:
an electronics enclosure including a base element and a cover element;
a perimeter mating groove defined by an inner groove wall and an outer grove wall;
a perimeter tongue element positioned within said perimeter mating groove upon assembly of said electronics enclosure;
a plurality of crush ribs formed into said perimeter tongue element, said plurality of crush ribs providing conductive contact between said base element and said cover element such that the EMC performance of an electronic component positioned within said electronics enclosure is improved.

12. An electronics enclosure as described in claim 11, further comprising:
an adhesive material positioned within said perimeter mating groove such that said cover element is sealed to said base element.

13. An electronics enclosure as described in claim 11,
wherein said base element and said cover element comprise an aluminum alloy.

14. An electronics enclosure as described in claim 13,
wherein said plurality of crush ribs are die cast into said perimeter tongue element.

15. An electronics enclosure as described in claim 11,
wherein said plurality of crush ribs comprise triangular plate elements.

16. An electronics enclosure as described in claim 11,
wherein said plurality of crush ribs pierce said base element.

17. An electronics enclosure as described in claim 11,
wherein said plurality of crush ribs are positioned between said perimeter tongue element and said outer groove wall, said plurality of crush ribs providing conductive communication between said perimeter tongue element and said outer groove wall.

18. An electronics enclosure as described in claim 11,
wherein said plurality of crush ribs are positioned between said perimeter tongue element and said inner groove wall, said plurality of crush ribs providing conductive communication between said perimeter tongue element and said inner groove wall.

* * * * *